United States Patent
Chang et al.

(10) Patent No.: US 8,537,450 B2
(45) Date of Patent: Sep. 17, 2013

(54) TWO-DIMENSIONAL SCANNING AND REFLECTING DEVICE

(75) Inventors: Pin Chang, Hsinchu (TW); Chung-De Chen, Miaoli County (TW); Chien-Shien Yeh, Tainan County (TW); Hung-Chung Li, Hualien County (TW)

(73) Assignee: Industrial Technology Research Institute, Hsinchu (TW)

(*) Notice: Subject to any disclaimer, the term of this patent is extended or adjusted under 35 U.S.C. 154(b) by 349 days.

(21) Appl. No.: 13/104,122

(22) Filed: May 10, 2011

(65) Prior Publication Data
US 2012/0218612 A1    Aug. 30, 2012

(30) Foreign Application Priority Data
Feb. 25, 2011    (TW) ............... 100106512 A (51) Int. Cl.
G02B 26/08    (2006.01)
(52) U.S. Cl.
USPC ............. 359/224.1; 359/199.4; 359/200.8; 359/224.2
(58) Field of Classification Search
USPC ................................. 359/196.1–226.2
See application file for complete search history.

(56) References Cited

U.S. PATENT DOCUMENTS

| | | | |
|---|---|---|---|
| 5,444,565 A * | 8/1995 | Goto | .......... 359/224.1 |
| 6,882,462 B2 | 4/2005 | Helsel et al. | |
| 6,965,177 B2 | 11/2005 | Turner et al. | |
| 7,377,439 B1 | 5/2008 | Merchant | |
| 7,394,583 B2 | 7/2008 | Akedo et al. | |
| 7,442,918 B2 | 10/2008 | Sprague et al. | |
| 7,446,919 B2 | 11/2008 | Wood | |
| 7,659,918 B2 | 2/2010 | Turner | |
| 2010/0296147 A1 * | 11/2010 | Terada et al. | .......... 359/224.1 |

OTHER PUBLICATIONS

K. Yamada et al., "A novel asymmetric silicon micro-mirror for optical beam scanning display", 1998 IEEE, pp. 110-115.

Maxim Lebedev, "Optical Micro-Scanner Fabricated on Stainless Steel by Aerosol Deposition Method", 2004 IEEE International Ultrasonics, Ferroelectrics, and Frequency Control Joint 50th Anniversary Conference, pp. 165-168.

* cited by examiner

Primary Examiner — James Phan
(74) Attorney, Agent, or Firm — Rabin & Berdo, P.C.

(57) ABSTRACT

A two-dimensional scanning and reflecting device includes a vibration component and a scanning component. The vibration component has a free end. The scanning component includes a frame body, a mass block, and a mirror. The frame body is connected to the free end of the vibration component. A natural frequency of the mirror corresponds to a second frequency. The mass block is disposed on the frame body in an eccentric manner, and the mass block and the natural frequency of the mirror correspond to a first frequency. When the vibration component receives a multi-frequency signal having the first frequency and the second frequency, the mirror vibrates in an axial direction with the first frequency, and vibrates in another axial direction with the second frequency.

18 Claims, 10 Drawing Sheets

TWO-DIMENSIONAL SCANNING AND REFLECTING DEVICE

CROSS-REFERENCE TO RELATED APPLICATIONS

This non-provisional application claims priority under 35 U.S.C. §119(a) on Patent Application No(s). 100106512 filed in Taiwan, R.O.C. on Feb. 25, 2011, the entire contents of which are hereby incorporated by reference.

BACKGROUND

1. Field of Invention

The present invention relates to a scanning and reflecting device, and more particularly to a two-dimensional scanning and reflecting device.

2. Related Art

The main stream of electronic products is light, thin, short, small, and portable at present, and almost all the components develop toward miniaturization, so a micro projector arises. The current micro projector may be divided into the following three different technologies. One is a laser micro projection technology, in which a laser is used as a light source, a micro scanning mirror is manufactured by using a Micro Electronic Mechanical System (MEMS) process, and the micro scanning mirror may scan in horizontal and vertical axial directions, and rapidly and precisely reflects a laser beam to form projection imaging. The second technology is a Digital Light Processing (DLP) technology, in which an image is generated through a Digital Micromirror Device (DMD), and in the DMD, a matrix made up of micro lenses (precise and micro mirrors) is disposed on a semiconductor chip, and each micro lens controls one pixel in a projected frame. The third technology is a reflective Liquid Crystal on Silicon Color Sequence (LCoS CS) technology, in which a fixed light microscope on a surface of a chip is used, and the intensity of the light reflection is controlled through a liquid crystal array to project a finally constituted frame.

Compared with the DLP and the LCoS micro projection technology, the laser micro projection technology has the following advantages: the least power consumption (the power used by an embedded projection module is less than 1 W), the maximum size of the projected image (the size may exceed 100 inches), and no need to focus. In addition, the laser micro projection technology may provide 1080P extra high definition. In contrast, the definition of the current DLP and the LCoS micro projection products merely supports 480*320 pixels or VGA640*480 pixels.

One of the key technologies of the micro projector is that a rotation angle of the mirror should be large and a rotation frequency should be high. As for 800*600 pixels, to reach 30 frames per second, the velocity of a fast axis should be more than 18 kHz.

In order to achieve a high scanning velocity, in the prior art, a driving mode of the mirror in the current laser micro projection technology includes an electromagnetic mode and an electrostatic mode, so as to change the design of the mirror in response to various driving modes.

SUMMARY

Accordingly, the present invention is a two-dimensional scanning and reflecting device, which is applicable to a scanning projector, and comprises a vibration component and a scanning component.

The vibration component has a free end, receives a multi-frequency signal, and vibrates on the free end according to the multi-frequency signal, in which the multi-frequency signal comprises a first frequency and a second frequency. The scanning component comprises a frame body, a mass block, and a mirror. The frame body is connected to the free end of the vibration component, and has a first accommodation space. The mass block is located in the first accommodation space, is connected to the frame body through a first connecting rod, and has a second accommodation space. The mirror is located in the second accommodation space, is connected to the mass block through a second connecting rod, and has a second natural frequency, in which the second natural frequency corresponds to the second frequency.

A second eccentric distance exists between a second mass center of the mirror and the second connecting rod.

A first eccentric distance exists between a first mass center of the mass block and the mirror and the first connecting rod. The mass block and the mirror have a first natural frequency, in which the first natural frequency corresponds to the first frequency, and the mass block and the mirror resonate with the first frequency along the first connecting rod.

The second frequency is higher than the first frequency. A first axial direction of the first connecting rod and a second axial direction of the second connecting rod are substantially perpendicular to each other.

According to the present invention, a large scanning angle is obtained through the eccentric structure, and the efficacy of biaxial scanning is achieved by merely using a single vibrator in the two-dimensional scanning and reflecting device provided by the present invention, so that the desirable effect can be realized through a rather simple structure.

BRIEF DESCRIPTION OF THE DRAWINGS

The present invention will become more fully understood from the detailed description given herein below for illustration only, and thus are not limitative of the present invention, and wherein.

DETAILED DESCRIPTION

The detailed features and advantages of the present invention are described below in great detail through the following embodiments, and the content of the detailed description is sufficient for those skilled in the art to understand the technical content of the present invention and to implement the present invention there accordingly. Based upon the content of the specification, the claims, and the drawings, those skilled in the art can easily understand the relevant objectives and advantages of the present invention.

Figure 1:
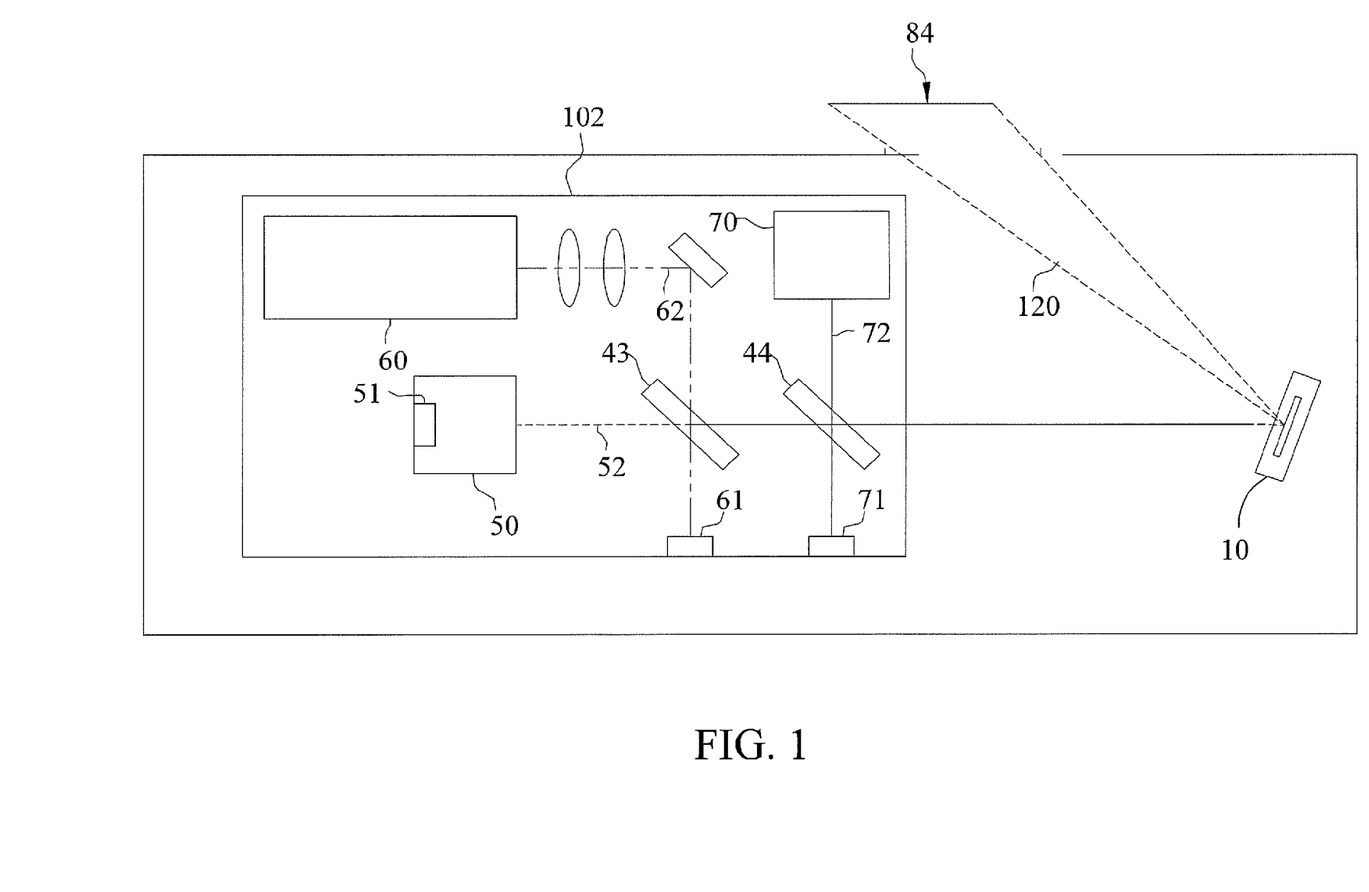
FIG. 1 is a schematic architectural view of an optical scanning projection system applying the present invention.

FIG. 1 is a schematic architectural view of an optical scanning projection system applying the present invention. Referring to FIG. 1, a two-dimensional scanning and reflecting device 10 is applicable to a mobile projection device, for example but not limited to, a cell phone or a Personal Digital Assistant (PDA). The mobile projection device may comprise, but is not limited to, a scanning light source assembly 102 and the two-dimensional scanning and reflecting device 10.

A reflected light 120 from the two-dimensional scanning and reflecting device 10 is reflected in a scanning manner, and then a projected frame 84 is obtained.

In this embodiment, the scanning light source assembly 102 may comprise, but is not limited to, a secondary light source 50, a secondary light source 60, a secondary light source 70, a photometer 51, a photometer 61, a photometer 71, a spectroscope 43, and a spectroscope 44. The secondary light source 50 may emit a red secondary beam 52, the secondary light source 60 may emit a green secondary beam 62, the secondary light source 70 may emit a blue secondary beam 72, and the secondary light source 50, the secondary light source 60, and the secondary light source 70 may be, but is not limited to, a semiconductor laser. That is to say, the secondary light source 50, the secondary light source 60, and the secondary light source 70 may also be a solid-state laser. A part of the red secondary beam 52 may be incident on the photometer 51 built in the secondary light source 50, and the remaining red secondary beam 52 may completely penetrate the spectroscope 43 and the spectroscope 44. The incidence of the green secondary beam 62 on the spectroscope 43 may be, but is not limited to, the following cases: 5% green secondary beam 62 penetrates the spectroscope 43 and is incident on the photometer 61, or 95% green secondary beam 62 is reflected by the spectroscope 43 and penetrates the spectroscope 44. The incidence of the blue secondary beam 72 on the spectroscope 44 may be, but is not limited to, the following cases: 5% blue secondary beam 72 penetrates the spectroscope 44 and is incident on the photometer 71, or 95% blue secondary beam 72 is reflected by the spectroscope 44.

Figure 2A:
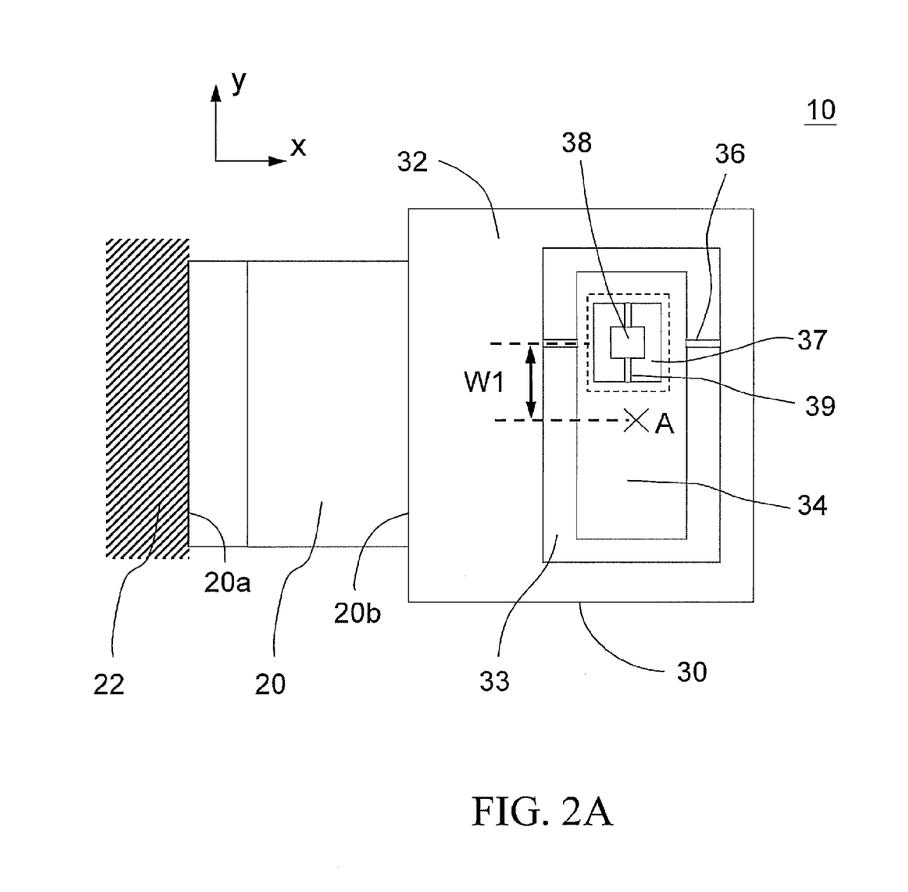
FIG. 2A is a top view of a two-dimensional scanning and reflecting device according to the present invention.

FIG. 2A is a top view of a two-dimensional scanning and reflecting device according to the present invention.

Referring to FIG. 2A, the two-dimensional scanning and reflecting device 10 comprises a vibration component 20 and a scanning component 30.

The vibration component 20 may receive a multi-frequency signal, in which the multi-frequency signal may be formed through superposition of an Alternating Current (AC) signal having a first frequency and an AC signal having a second frequency. The AC signal having the first frequency and the AC signal having the second frequency may also be respectively input into the vibration component 20 to form the multi-frequency signal. The vibration component 20 has a fixed end 20a and a free end 20b, in which the fixed end 20a may be fixed on a relatively immovable substrate 22, for example but not limited to, a case. After the vibration component 20 receives the multi-frequency signal, multi-frequency vibration (that is, vibration superposition of the first frequency and the second frequency) is generated on the free end 20b. In this embodiment, the vibration component 20 makes a displacement $u_z$ in a z-direction due to the vibration, and this phenomenon is similar to deflection of a beam, so that the vibration phenomenon of the vibration component may be explained by the following wave equation of the beam:

$$\frac{\partial^2}{\partial x^2}\left[E(x)I(x)\frac{\partial^2 u_z(x,t)}{\partial x^2}\right] + \rho(x)A(x)\frac{\partial^2 u_z(x,t)}{\partial t^2} = f(x,t),$$

where t is time, E(x) is Young's modulus, I(x) is an area moment of inertia of a beam section, ρ(x) is density, A(x) is a sectional area of the beam, f(x, t) is a lateral force per unit length acting on the beam. In the beam theory, a moment M is generated in the beam due to the deflection, and a relation thereof is as follows:

$$M(x,t) = E(x)I(x)\frac{\partial^2 u_z(x,t)}{\partial x^2}.$$

The moment is a vector, and in this embodiment, the direction of the moment M is parallel to a y-axis. The beam deflection $u_z$ is transferred to the scanning component 30 in a wave form, and thus the moment in a y-direction is generated in the scanning component 30.

The scanning component 30 comprises a frame body 32, a mass block 34, and a mirror 38.

The frame body 32 is connected to the vibration component 20. The vibration component 20 is disposed between the frame body 32 and the substrate 22. The frame body 32 has a first accommodation space 33. The first accommodation space 33 may be a space through the frame body 32, or a groove formed by hollowing out from a surface of the frame body 32.

The mass block 34 is located in the first accommodation space 33, and is connected to the frame body 32 through a first connecting rod 36. The first connecting rod 36 may be disposed on two sides of the mass block 34, and if the first connecting rod 36 has sufficient strength, the first connecting rod 36 may be merely disposed on one side of the mass block 34. The mass block 34 has a second accommodation space 37. The second accommodation space 37 may be a space through the mass block 34, or a groove formed by hollowing out from a surface of the mass block 34.

The mirror 38 is located in the second accommodation space 37, and is connected to the mass block 34 through a second connecting rod 39. The second connecting rod 39 may be disposed on two sides of the mass block 34, and if the second connecting rod 39 has sufficient strength, the second connecting rod 39 may be merely disposed on one side of the mirror 38.

A mass center point of the overall structure of the mass block 34 and the mirror 38 is a first mass center A. A distance from a line segment extending from the first connecting rod 36 to the first mass center A is a first eccentric distance W1, that is to say, the location of the first mass center A is not on the first connecting rod 36. The overall structure of the mass block 34, the mirror 38, and the first connecting rod 36 has a natural frequency. The natural frequency may correspond to the first frequency through an appropriate design (the details are described later), that is to say, the natural frequency and the first frequency may be the same or have a relation of frequency multiplication.

In an embodiment of the present invention, a light-absorbing material is applied on the surface of the frame body 32, the mass block 34, the first connecting rod 36, and the second connecting rod 39, that is to say, the frame body 32, the mass block 34, the first connecting rod 36, and the second connecting rod 39 may absorb the laser beam emitted by the scanning light source assembly 102. In addition to the foregoing manners, the sectional area of the laser beam may be set smaller than the area of the mirror 38, and meanwhile, the laser beam is prevented from irradiating onto a region other than the mirror 38 through precise assembly and alignment.

Figure 2B:
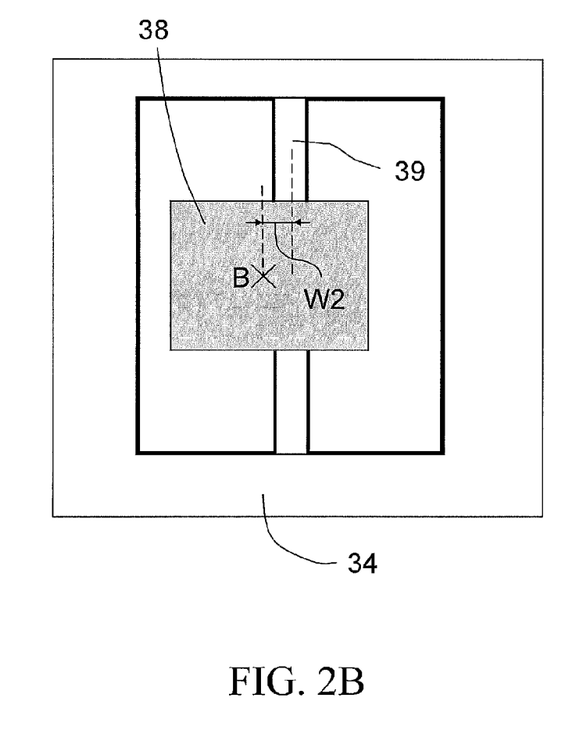
FIG. 2B is a partial enlarged view of FIG. 2A.

FIG. 2B is a partial enlarged view of FIG. 2A. Referring to FIG. 2B, the mass center of the mirror 38 is a second mass center B. A distance from a line segment extending from the second connecting rod 39 to the second mass center B is a second eccentric distance W2. The mirror 38 and the second connecting rod 39 have another natural frequency. The another natural frequency may correspond to the second frequency through an appropriate design.

Figure 3:
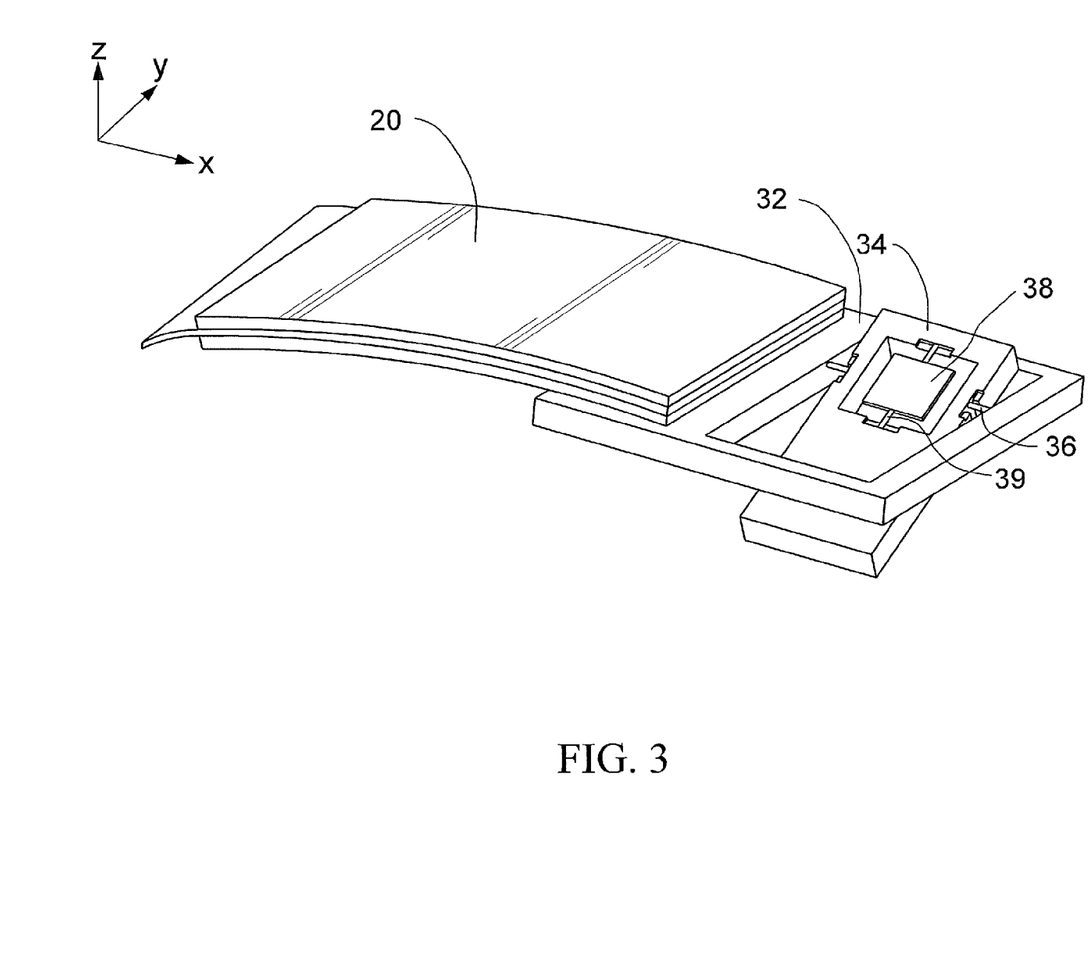
FIG. 3 is a top view of the two-dimensional scanning and reflecting device according to the present invention.

FIG. 3 is a top view of the two-dimensional scanning and reflecting device according to the present invention. Referring to FIG. 3, when the vibration component 20 vibrates with the first frequency and the second frequency, the mass block 34 and the mirror 38 may resonate with the first frequency, and torsional vibration is generated along an axial direction of the first connecting rod 36 (the direction of an x-axis in FIG. 2A). In addition, the mirror 38 may resonate with the second frequency, and torsional vibration is generated along an axial direction of the second connecting rod 39 (the direction of a y-axis in FIG. 2A). In this embodiment, the axial direction of the first connecting rod 36 and the axial direction of the second connecting rod 39 are substantially perpendicular to each other.

Specifically, since the vibration component 20 makes a displacement in a z-axis direction, the frame body 32 is driven to move in the z-axis direction. The displacement in the z-axis direction may be converted into a moment in the x-axis direction by using an eccentric principle, so that the mass block 34 and the mirror 38 generate torsional vibration with the first connecting rod 36 as the axis. When the first frequency is equal to a natural frequency of the torsional vibration, the torsional angle is the largest due to resonance. Therefore, if no eccentricity exists, the first frequency cannot drive the mass block 34 to generate the vibration in a large angle.

The resonance generated by the second frequency enables the mirror 38 to generate torsional vibration with the second connecting rod 39 as the axis. A vibration mechanism thereof is as follows: in addition to the moment generated by the displacement in the z-axis direction and the eccentricity, the moment in the y-axis direction generated by the vibration component due to deflection is directly transferred to the mirror 38, so that the mirror 38 generates the torsional vibration. If the mirror 38 has the eccentricity, the following two moments exist: one is the moment generated by the displacement in the z-axis direction and the eccentricity, the other is the moment generated by the vibration component 20 due to the deflection and directly transferred to the mirror 38. If the mirror 38 has no eccentricity, the moment directly transferred to the mirror 38 due to bending of the vibration component 20 merely exists.

Figure 4:
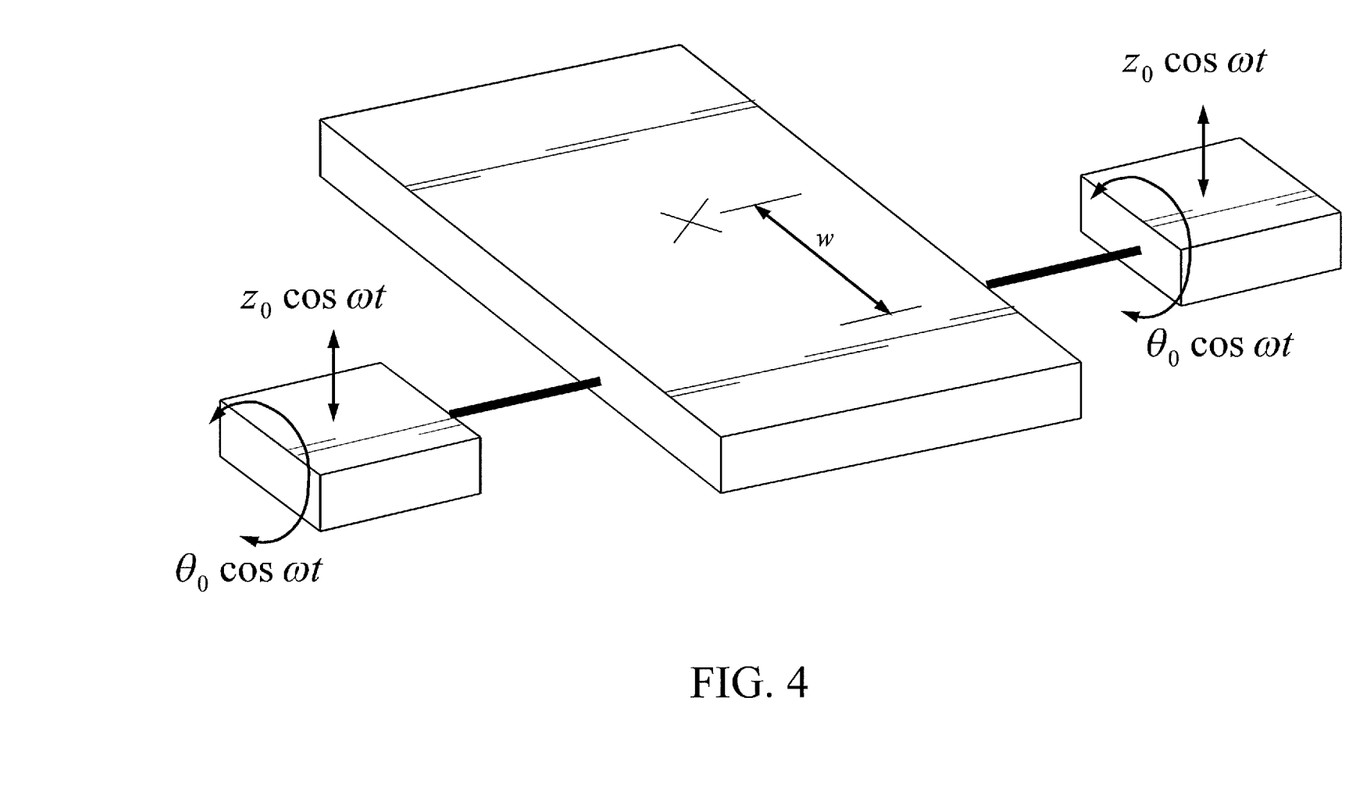
FIG. 4 is a schematic view of torsional vibration according to the present invention.

FIG. 4 is a schematic view of torsional vibration according to the present invention. Referring to FIG. 4, the mirror 38 is taken as an example, and the mirror 38 is connected to the mass block 34 through the second connecting rod 39. The second connecting rod 39 and the mass center of the mirror 38 have an eccentricity w, and the peripheral structure (the mass block 34) has a vibration amount $z_0 \cos \omega t$ perpendicular to a plane of the mass block 34 (derived from the displacement in the z-direction of the vibration component 20) and a rotational vibration amount $\theta_0 \cos \omega t$ (derived from the moment in the y-direction generated by the vibration component 20 due to the deflection), where $\omega$ is a vibration frequency, t is time, $z_0$ is amplitude of the vibration displacement, and $\theta_0$ is amplitude of the vibration angle. A mass moment of inertia about the axis, parallel to the connecting rod direction and passing through the mass center thereof, is $I_c$. According to the principle of the vibration theory, the mass may generate the torsional vibration with the connecting rod as the axle center due to the moment caused by the eccentricity w, and a equation of motion thereof is as follows:

$$(I_c + mw^2)\ddot{\theta} + k\theta = (mw\omega^2 z_0 + k\theta_0)\cos \omega t,$$

where k is torsional stiffness of the connecting rod, and $\theta$ is a rotational displacement of the mass. If damping is added, a steady state solution of the foregoing equation is as follows:

$$\theta = \frac{(mwz_0\omega^2/k) + \theta_0}{\sqrt{[1-(\omega/\omega_n)^2]^2 + [2\varsigma(\omega/\omega_n)]^2}} \cos(\omega t - \phi),$$

where $\varsigma$ is a damping ratio, $\phi$ is a phase difference, and $$\omega_n = \sqrt{\frac{k}{I_C + mw^2}}.$$

When $\omega$ is equal to $\omega_n$, that is, when resonance occurs, the foregoing equation is as follows:

$$\theta = \left(\frac{mw}{I_c + mw^2}\right)\left(\frac{z_0}{2\varsigma}\right)\cos(\omega t - \phi) + \frac{\theta_0}{2\varsigma}\cos(\omega t - \phi).$$

The foregoing equation indicates the torsion vibration angle of the mirror during the resonance. The first item on the right of the equation $$\left(\frac{mw}{I_c + mw^2}\right)\left(\frac{z_0}{2\varsigma}\right)\cos(\omega t - \phi)$$

is generated by out-of-plane vibration $z_0$ plus the eccentricity w, and the second item on the right of the equation $$\frac{\theta_0}{2\varsigma}\cos(\omega t - \phi)$$

is driven by the moment generated by the vibration component due to the deflection. Therefore, it can be seen from the above that, the eccentricity may increase the torsion vibration angle of the mirror.

If the mass block 34 and the mirror 38 are taken as an example, the deduction of the vibration equation is similar to the case with only the mirror 38, and since the vibration component 20 merely makes the displacement in the z-direction, the expression of the vibration angle is similar to the foregoing equation, and it is only required to set $\theta_0$ to zero.

When two signals with frequencies $\omega_1$ and $\omega_2$ are input into the vibration component 20 at the same time, according to a mode superposition principle in the vibration theory, the mirror 38 has torsional vibration in the x-axis and y-axis directions at the same time. In addition, the second frequency $\omega_2$ is higher than the first frequency $\omega_1$. The mirror 38 may use one of the x-axis and y-axis as a fast axis, and the other as a slow axis, so as to vibrate on the two axes with different frequencies. When the laser beam irradiates onto the mirror 38, the mirror 38 reflects and projects the laser beam onto a screen, and thus two-dimensional scanning may be performed.

Figure 5A:
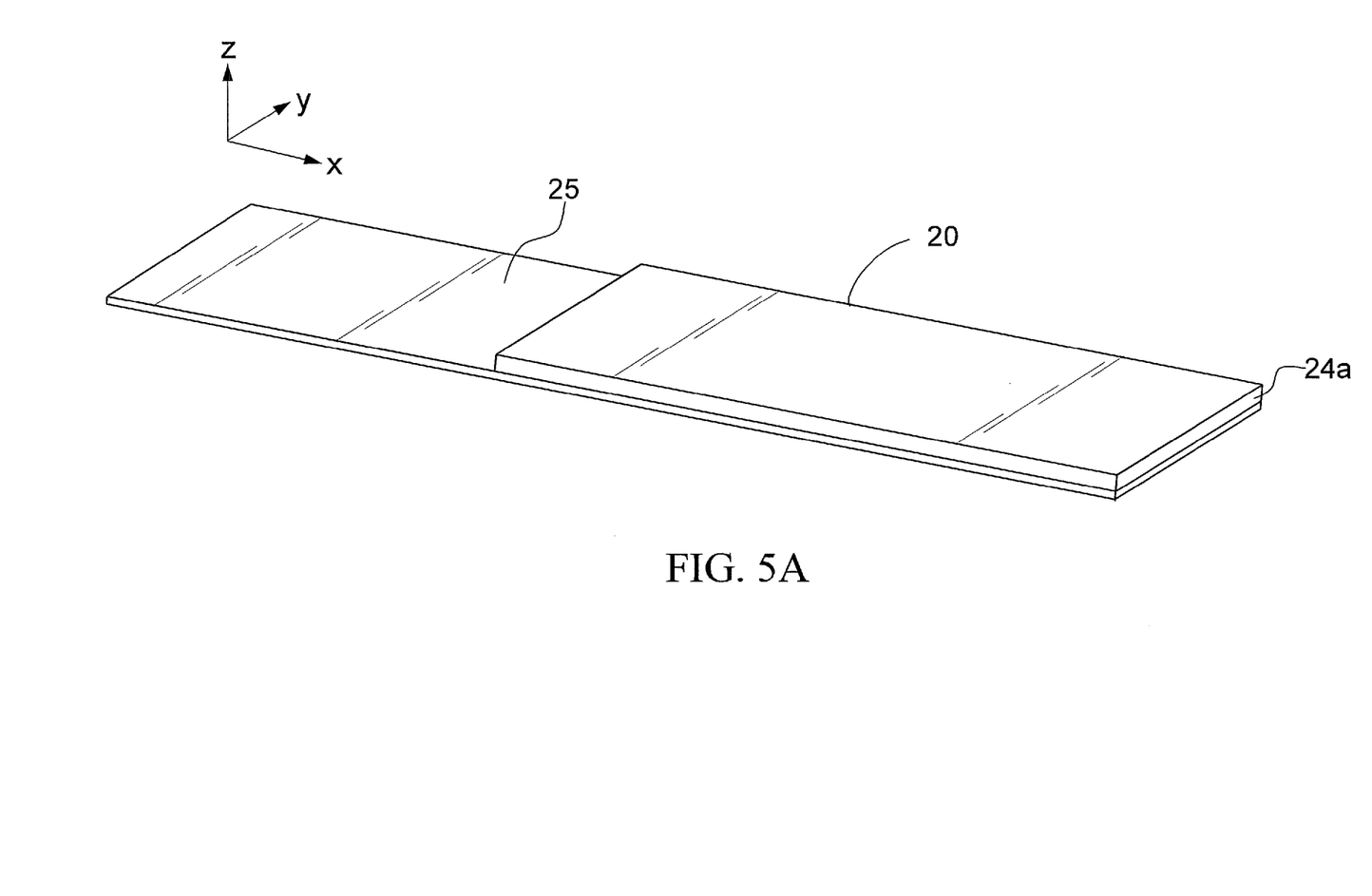
FIG. 5A is a side view of a first embodiment of a vibration component according to the present invention.
Figure 5B:
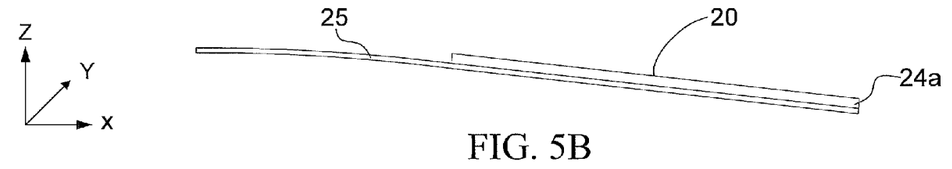
FIGS. 5B to 5E are schematic views of vibration modes of the vibration component according to the present invention.
Figure 5C:
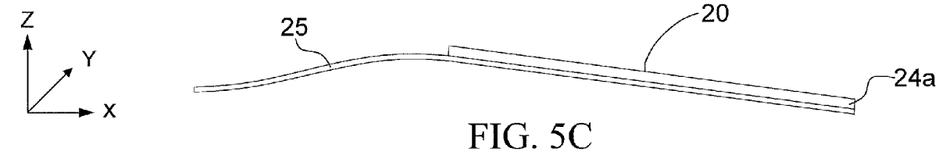

FIG. 5A is a side view of a first embodiment of the vibration component according to the present invention. Referring to FIG. 5A, the vibration component 20 comprises a first piezoelectricity layer 24a and a connecting board 25. The connecting board 25 has a first surface 25a. The first piezoelectricity layer 24a is disposed on the first surface 25a and has a free end 20b.

When the signals with the first frequency $\omega_1$ and the second frequency $\omega_2$ are input into the vibration component 20, the vibration component 20 deforms due to a piezoelectricity effect, and a joint between the vibration component 20 and the frame body 32 makes translational vibration in a z-axis direction. Since the fixed end 20a of the vibration component 20 is connected to the substrate 22, and the free end 20b is connected to the scanning component 30, the translational vibration may cause a moment acting on the scanning component 30, to make the scanning component 30 vibrate.

When frequency signals are input, the vibration component 20 may deform. Since the vibration component 20 has more than one natural frequency, when different signals are input, the vibration component 20 resonates with different frequencies, and the deformation modes of the vibration component 20 are also different.

FIGS. 5B to 5E are schematic views of vibration modes of the vibration component according to the present invention. FIGS. 5B to 5E respectively correspond to vibration modes with four different natural frequencies, and the natural frequencies corresponding to FIGS. 5B to 5E are in an ascending order.

In these vibration modes, the vibration component is bent, a moment exists in the vibration component (in a direction along the y-axis), and transversal displacement (in a direction along the z-axis) occurs on an endpoint of the vibration component.

When an AC signal is input, if the frequency of the AC signal is close to one of the natural frequencies of the vibration component, since a corresponding mode is activated due to the resonance principle, the vibration component 20 may generate a large vibration amount.

Figure 5D:
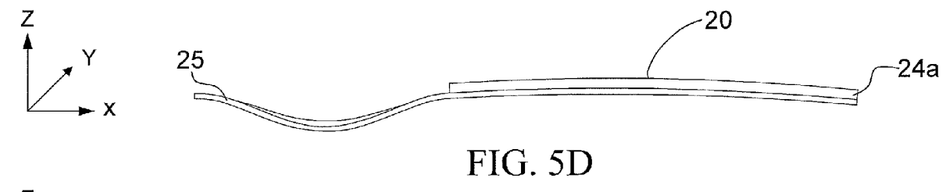
Figure 5E:
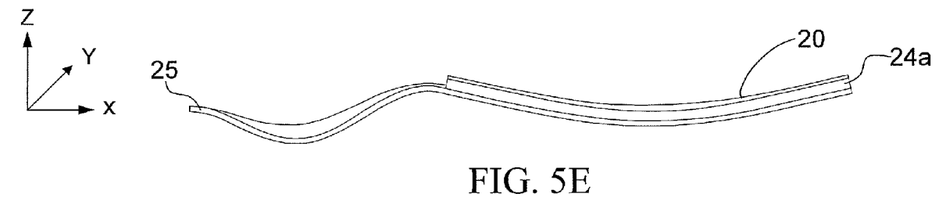

When the natural frequency is high (as shown in FIGS. 5D and 5E), in addition to the moment along the y-axis direction, the moment along the x-axis direction also exists. That is to say, in FIGS. 5D and 5E, the vibration component 20 may vibrate in two different axial directions.

It should be noted that, FIGS. 5B to 5E show the vibration modes of the vibration component 20 with a special size or a special shape. The vibration component 20 with different sizes or different shapes may have different vibration modes and different natural frequencies. That is to say, the vibration mode and the natural frequency of the vibration component 20 are not limited to the cases as shown in FIGS. 5B to 5E.

Figure 6:
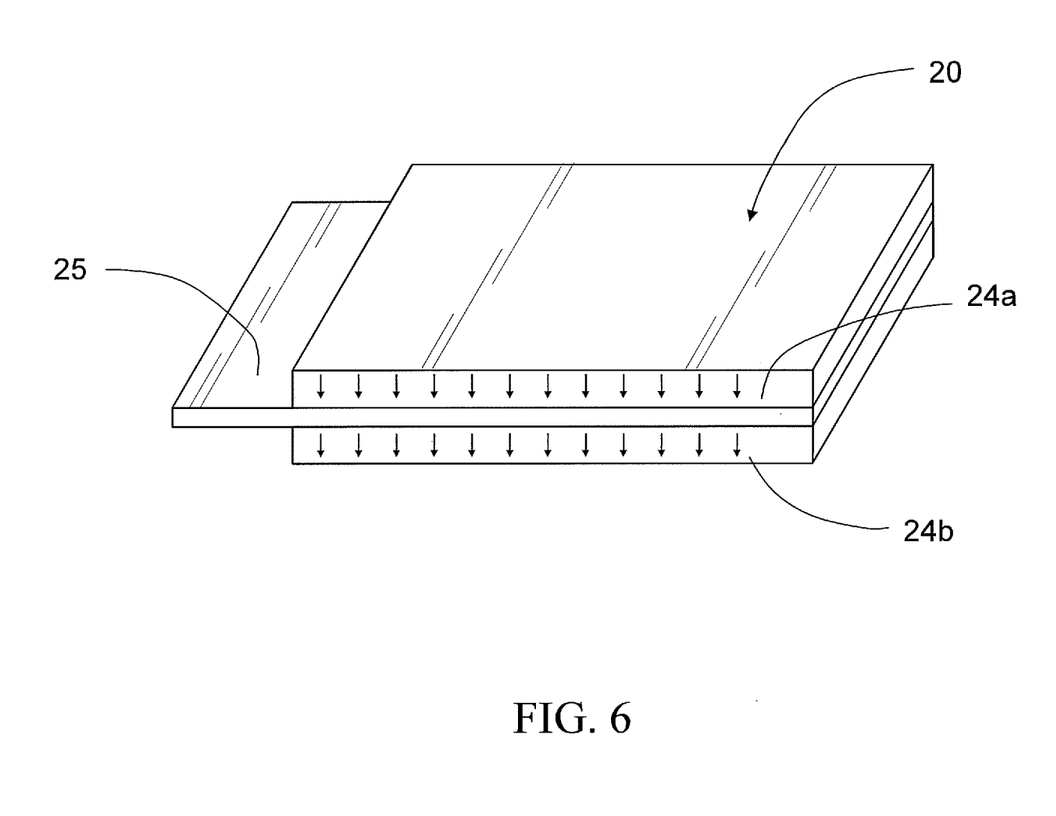
FIG. 6 is a schematic three-dimensional view of a second embodiment of the vibration component according to the present invention.

FIG. 6 is a schematic three-dimensional view of a second embodiment of the vibration component according to the present invention. Referring to FIG. 6, the vibration component 20 comprises a first piezoelectricity layer 24a, a second piezoelectricity layer 24b, and a connecting board 25. The connecting board 25 is located between the first piezoelectricity layer 24a and the second piezoelectricity layer 24b. The connecting board 25 may be a conductive material, and the conductive material may be grounded. In addition, electrodes may be plated on upper and lower surfaces of the connecting board 25, and are grounded at the same time. An electrode is respectively plated on an upper surface of the first piezoelectricity layer 24a and a lower surface of the second piezoelectricity layer 24b, and the electrode on the first piezoelectricity layer 24a is electrically connected to the electrode on the second piezoelectricity layer 24b. In addition, polarization directions of the first piezoelectricity layer 24a and the second piezoelectricity layer 24b are the same. Therefore, the first piezoelectricity layer 24a and the second piezoelectricity layer 24b may vibrate toward the same direction, to cause the scanning component 30 to vibrate.

Figure 7:
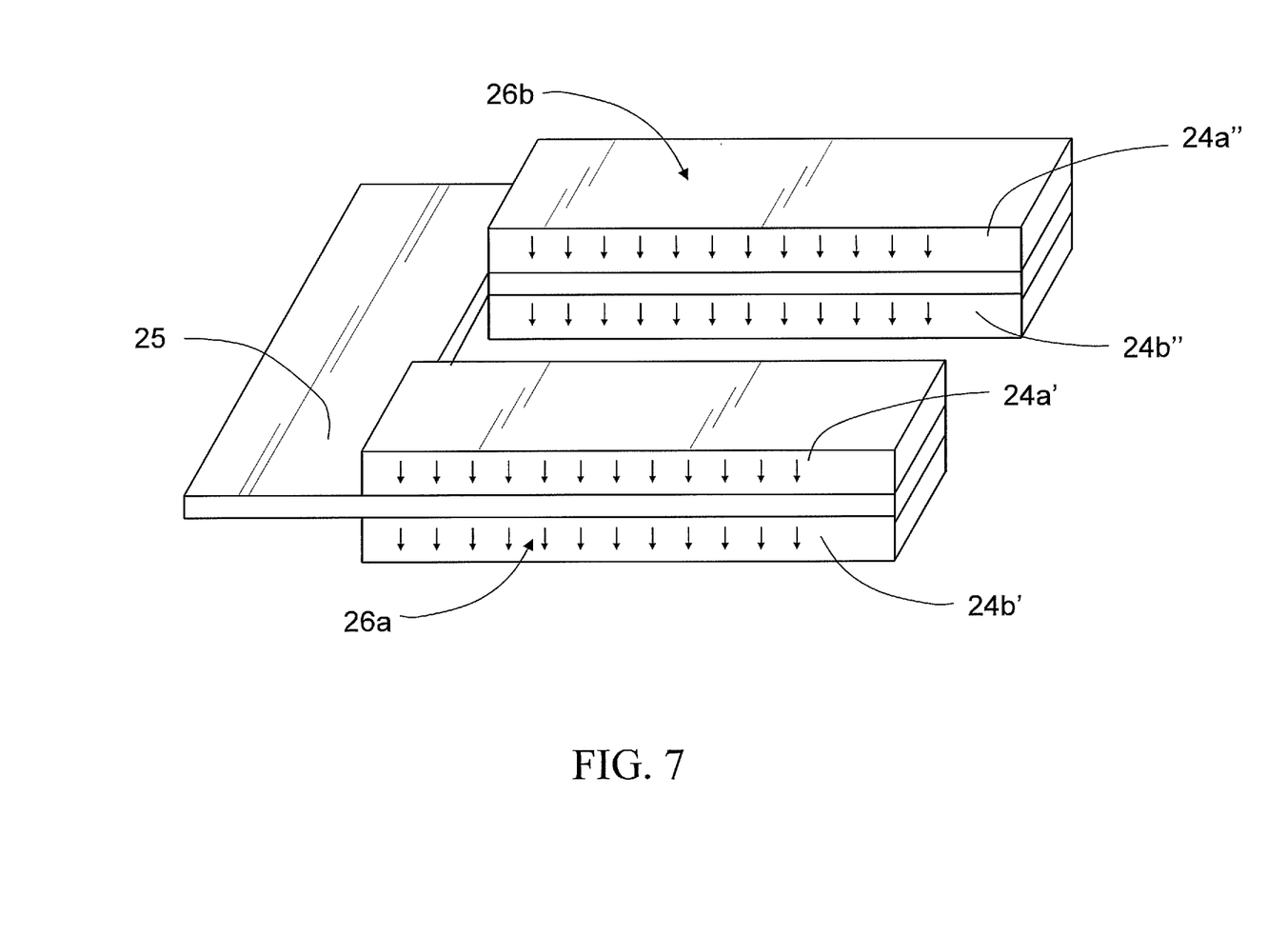
FIG. 7 is a schematic three-dimensional view of a third embodiment of the vibration component according to the present invention.

FIG. 7 is a schematic three-dimensional view of a third embodiment of the vibration component according to the present invention. Referring to FIG. 7, the vibration component 20 is U-shaped. The vibration component 20 comprises a first vibration arm 26a, a second vibration arm 26b, and a connecting board 25. The first vibration arm 26a comprises a first piezoelectricity layer 24a' and a second piezoelectricity layer 24b', and the connecting board 25 is located between the first piezoelectricity layer 24a' and the second piezoelectricity layer 24b'. The second vibration arm 26b comprises a first piezoelectricity layer 24a" and a second piezoelectricity layer 24b", and the connecting board 25 is located between the first piezoelectricity layer 24a" and the second piezoelectricity layer 24b".

Electrodes are disposed on upper surfaces of the first piezoelectricity layer 24a' and the first piezoelectricity layer 24a", and electrodes are disposed on lower surfaces of the second piezoelectricity layer 24b' and the second piezoelectricity layer 24b". The electrodes on the first piezoelectricity layer 24a' and the second piezoelectricity layer 24b' are electrically connected to each other, and the electrodes on the first piezoelectricity layer 24a" and the second piezoelectricity layer 24b" are also electrically connected to each other. Therefore, a signal with the first frequency $\omega_1$ may be input into the first vibration arm, and the signal with the second frequency $\omega_2$ may be input into the second vibration arm; or, the signal with the first frequency $\omega_1$ may be input into the second vibration arm, and the signal with the second frequency $\omega_2$ may be input into the first vibration arm. In this manner, the vibration component 20 is enabled to vibrate with the first frequency $\omega_1$ and the second frequency $\omega_2$.

Figure 8:
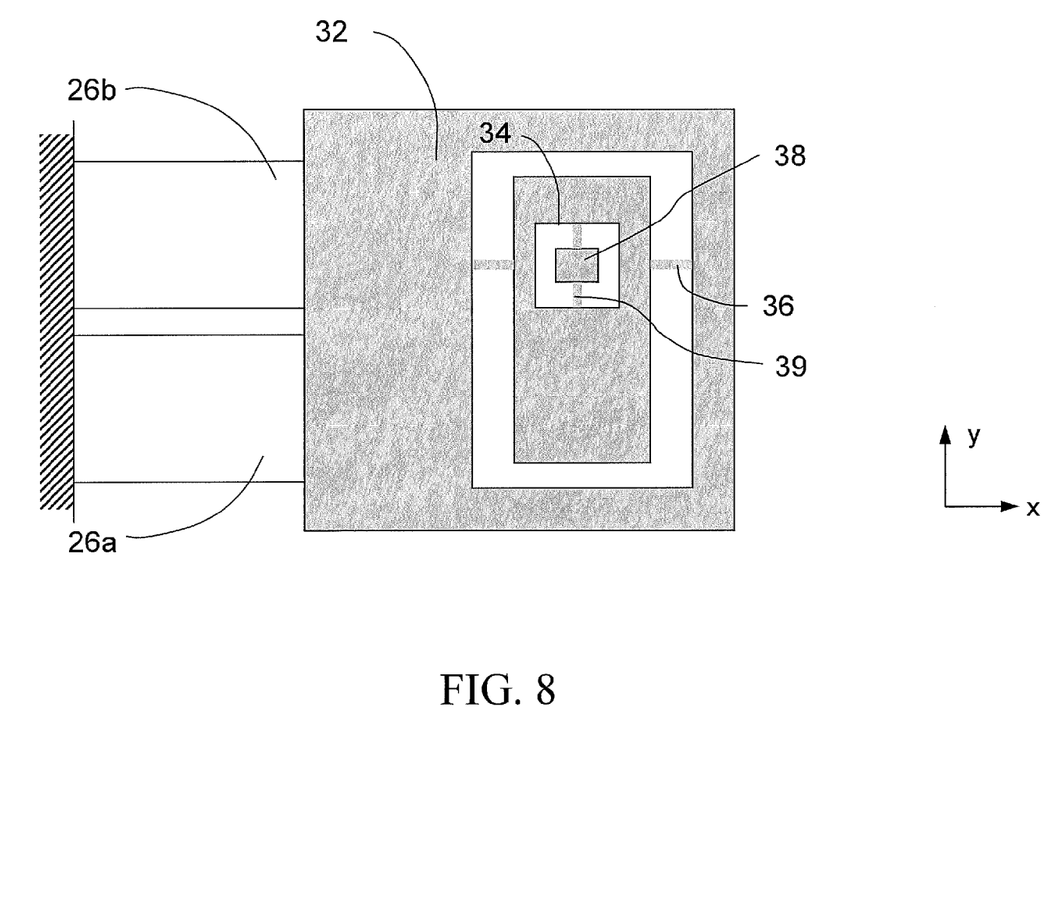
FIG. 8 is a top view of the third embodiment of the vibration component according to the present invention.

FIG. 8 is a top view of the third embodiment of the vibration component according to the present invention. Referring to FIG. 8, the first vibration arm 26a and the second vibration arm 26b are connected to the scanning component 30, and thus, the scanning component 30 vibrates with the first frequency $\omega_1$ and the second frequency $\omega_2$.

According to the present invention, a large scanning angle is obtained through the eccentric structure, and the efficacy of biaxial scanning is achieved by merely using a single vibrator in the two-dimensional scanning and reflecting device provided by the present invention, so that the desirable effect can be realized through a rather simple structure.

What is claimed is:

1. A two-dimensional scanning and reflecting device, comprising:
    a vibration component, having a free end, and the vibration component receiving a multi-frequency signal and vibrating on the free end according to the multi-frequency signal, wherein the multi-frequency signal comprises a first frequency and a second frequency; and
    a scanning component, comprising:
        a frame body, connected to the free end of the vibration component, and having a first accommodation space;
        a mass block, located in the first accommodation space, connected to the frame body through a first connecting rod, and having a second accommodation space; and a mirror, located in the second accommodation space, connected to the mass block through a second connecting rod, and having a second natural frequency, wherein the second natural frequency corresponds to the second frequency, wherein a first eccentric distance exists between a first mass center of the mass block and the mirror and the first connecting rod, the mass block and the mirror have a first natural frequency, the first natural frequency corresponds to the first frequency, and the mass block and the mirror resonate with the first frequency along the first connecting rod.

2. The two-dimensional scanning and reflecting device according to claim 1, wherein a second eccentric distance exists between a second mass center of the mirror and the second connecting rod.

3. The two-dimensional scanning and reflecting device according to claim 1, wherein the second frequency is higher than the first frequency.

4. The two-dimensional scanning and reflecting device according to claim 1, wherein a first axial direction of the first connecting rod and a second axial direction of the second connecting rod are perpendicular to each other.

5. The two-dimensional scanning and reflecting device according to claim 1, wherein the vibration component comprises:
a connecting board, having a first surface; and
a first piezoelectricity layer, disposed on an end of the first surface of the connecting board, having the free end, and the first piezoelectricity layer receiving the multi-frequency signal and vibrating on the free end according to the multi-frequency signal.

6. The two-dimensional scanning and reflecting device according to claim 5, wherein one end of the vibration component is connected to a substrate, and the other end of the vibration component is connected to the scanning component.

7. The two-dimensional scanning and reflecting device according to claim 5, wherein the connecting board is a conductive material.

8. The two-dimensional scanning and reflecting device according to claim 1, wherein the vibration component comprises a first piezoelectricity layer, a second piezoelectricity layer, and a connecting board, the connecting board is located between the first piezoelectricity layer and the second piezoelectricity layer, and the first piezoelectricity layer and the second piezoelectricity layer receive the multi-frequency signal and vibrate with the first frequency and the second frequency.

9. The two-dimensional scanning and reflecting device according to claim 8, wherein one end of the vibration component is connected to a substrate, and the other end of the vibration component is connected to the scanning component.

10. The two-dimensional scanning and reflecting device according to claim 8, wherein an electrode is respectively plated on an upper surface of the first piezoelectricity layer and a lower surface of the second piezoelectricity layer, and the two electrodes are electrically connected to each other.

11. The two-dimensional scanning and reflecting device according to claim 8, wherein the connecting board is a conductive material.

12. The two-dimensional scanning and reflecting device according to claim 1, wherein the vibration component comprises a first vibration arm and a second vibration arm, the first vibration arm and the second vibration arm are connected between a fixed end and the frame body, the first vibration arm vibrates with the first frequency according to the multi-frequency signal, and the second vibration arm vibrates with the second frequency according to the multi-frequency signal.

13. The two-dimensional scanning and reflecting device according to claim 12, wherein one end of the vibration component is connected to a substrate, and the other end of the vibration component is connected to the scanning component.

14. The two-dimensional scanning and reflecting device according to claim 12, wherein the vibration component is U-shaped.

15. The two-dimensional scanning and reflecting device according to claim 12, wherein the first vibration arm and the second vibration arm comprise a first piezoelectricity layer, a second piezoelectricity layer, and a connecting board.

16. The two-dimensional scanning and reflecting device according to claim 15, wherein an electrode is respectively plated on an upper surface of the first piezoelectricity layer and a lower surface of the second piezoelectricity layer, and the two electrodes are electrically connected to each other.

17. The two-dimensional scanning and reflecting device according to claim 15, wherein the connecting board is a conductive material.

18. The two-dimensional scanning and reflecting device according to claim 1, wherein a light-absorbing material is on the surface of the frame body and the mass block.

* * * * *